United States Patent
Nagoya (10) Patent No.: US 6,701,475 B1
(45) Date of Patent: Mar. 2, 2004

(54) BOUNDARY SCANNING ELEMENT AND COMMUNICATION EQUIPMENT USING THE SAME

(75) Inventor: Mitsugu Nagoya, 16-9 Akabanenishi 4-chome, Kita-ku, Tokyo 115-0055 (JP)

(73) Assignees: Koken Co. Ltd., Tokyo (JP); Mitsugu Nagoya, Tokyo (JP)

( * ) Notice: Subject to any disclaimer, the term of this patent is extended or adjusted under 35 U.S.C. 154(b) by 0 days.

(21) Appl. No.: 09/424,455

(22) PCT Filed: Jun. 2, 1998

(86) PCT No.: PCT/JP98/02432
§ 371 (c)(1),
(2), (4) Date: Nov. 23, 1999

(87) PCT Pub. No.: WO98/55927
PCT Pub. Date: Dec. 10, 1998

(30) Foreign Application Priority Data

Jun. 2, 1997 (JP) .............................................. 9-143804

(51) Int. Cl.⁷ ............................................. G01R 31/28
(52) U.S. Cl. ..................................................... 714/726
(58) Field of Search ................................. 370/402, 404, 370/241; 714/725–728, 30, 729, 730, 733, 734, 46, 724, 726; 340/825.52; 712/1, 205; 703/24; 710/5

(56) References Cited

U.S. PATENT DOCUMENTS

| | | | |
|---|---|---|---|
| 5,130,988 A | * | 7/1992 | Wilcox et al. ............... 714/727 |
| 5,132,635 A | * | 7/1992 | Kennedy .................... 324/763 |
| 5,325,368 A | * | 6/1994 | James et al. ................ 714/727 |
| 5,377,198 A | * | 12/1994 | Simpson et al. ............. 714/727 |
| 5,450,415 A | * | 9/1995 | Kamada ...................... 714/727 |
| 5,544,309 A | * | 8/1996 | Chang et al. ................. 714/30 |
| 5,617,420 A | | 4/1997 | Whetsel ...................... 370/402 |
| 5,737,497 A | * | 4/1998 | Ballard ........................ 706/47 |
| 5,862,152 A | * | 1/1999 | Handly et al. ............... 714/727 |

FOREIGN PATENT DOCUMENTS

| | | | |
|---|---|---|---|
| EP | 0 388 790 | 9/1990 | ........... G01R/31/28 |
| JP | 62-282280 | 12/1987 | |
| JP | 2-268281 | 11/1990 | ......... G01R/31/318 |
| JP | 4-281691 | 10/1992 | .......... H04N/17/00 |
| JP | 6-300821 | 10/1994 | ........... G01R/31/28 |
| JP | 8-233904 | 9/1996 | ........... G01R/31/28 |
| JP | 6-15299 | 1/1997 | ........... G01R/31/28 |

\* cited by examiner

Primary Examiner—Albert Decady
Assistant Examiner—Esaw Abraham
(74) Attorney, Agent, or Firm—Kanesaka & Takeuchi (57) ABSTRACT

A boundary scan element includes a plurality of input terminal side boundary cells connected in series; a plurality of output terminal side boundary cells connected in series; a TAP circuit for controlling input/output of data to/from the boundary cells on the input/output terminal sides; a TDI terminal for receiving serial data to be supplied to the boundary cells; a TDO terminal for outputting the data from the boundary cells as serial data; a TCK terminal for receiving clock signals; and a TMS terminal for receiving a mode signal to switch an operation mode of the TAP circuit, wherein the boundary cells on the input/output terminal sides are connected in parallel between the TDI and TDO terminals, respectively, and wherein two sets of combinations composed of the input terminal side boundary cells, the output terminal boundary cells, the TDI terminal, the TDO terminal and the TAP circuit are provided.

2 Claims, 7 Drawing Sheets

BOUNDARY SCANNING ELEMENT AND COMMUNICATION EQUIPMENT USING THE SAME

FIELD OF ART

The present invention relates to a boundary scan element used for a boundary scan testing method and a communication apparatus which applies the boundary scan element as a communication element thereto, more particularly to a boundary scan element for enabling high speed processing and a communication apparatus using the boundary scan element.

BACKGROUND OF THE INVENTION

Concerning a method for checking whether or not printed-wiring is correctly connected to corresponding IC chips and whether or not the printed-wiring is disconnected in a state where the IC chips are arranged on a wiring board on which the printed wiring is formed, a boundary scan testing method has been proposed.

Figure 3:
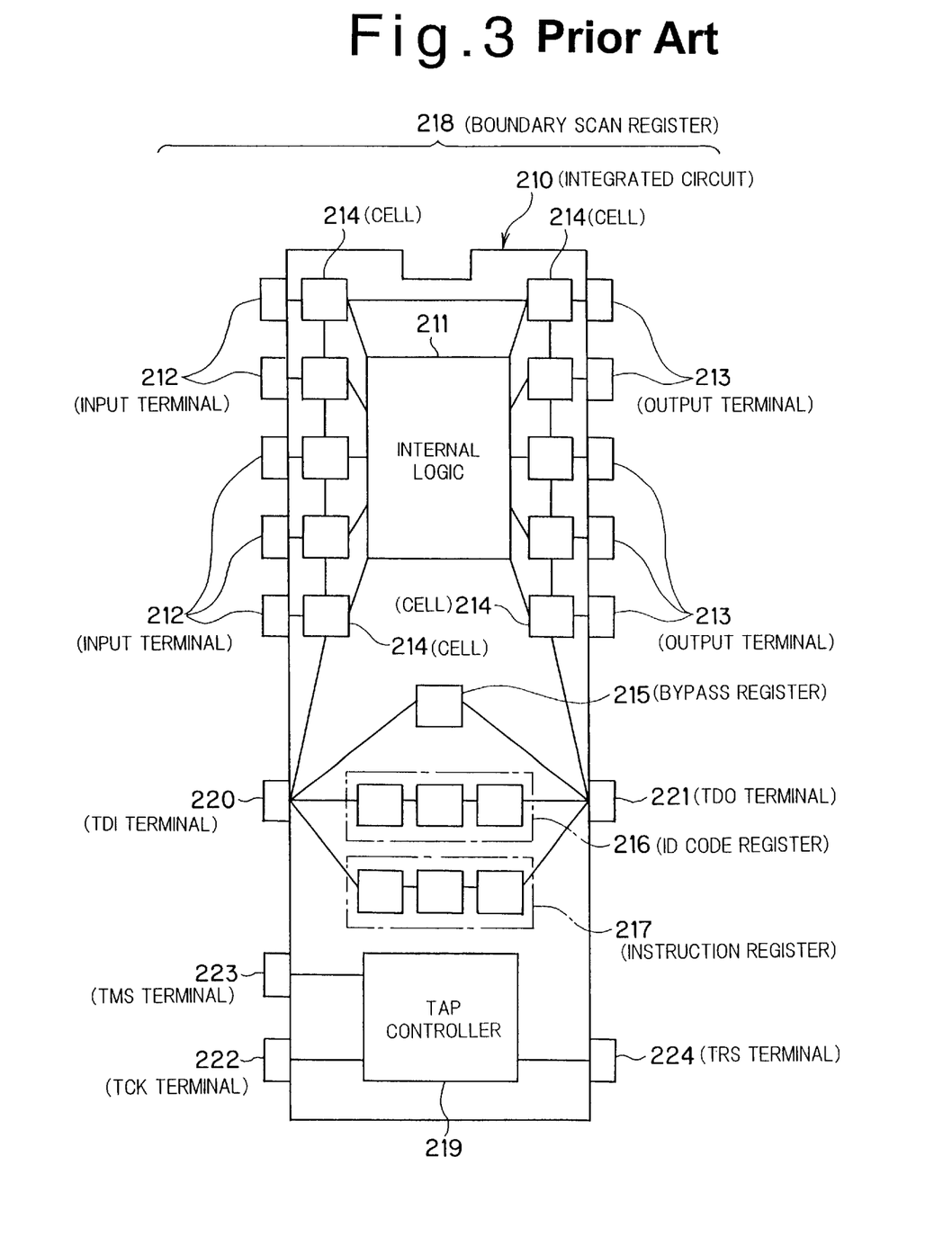
FIG. 3 is a block diagram of a conventional boundary scan element.

The boundary scan testing method can be implemented for semiconductor integrated circuits (IC chips) in which the boundary scan elements are integrated. As shown in FIG. 3, the boundary scan element is composed, for example, of a plurality of boundary cells 214, each of which is individually provided between an input/output terminal of an internal logic circuit 211 for allowing an integrated circuit 210 to achieve its inherent function and an input terminal 212 of the integrated circuit 210 as well as between the input/output terminal of the internal logic circuit 211 and an output terminal 213 of the integrated circuit 210; a TAP controller (TAP circuit) 219 for controlling input/output of data to/from each boundary cell 214; a TDI terminal 220 for receiving test data; a TDO terminal 221 for transmitting the test data; a TCK terminal 222 to which a clock signal is inputted; and a TMS terminal 223 for receiving a mode signal to switch an operation mode of the TAP controller 219. Further, the boundary scan element may optionally be provided with any of a bypass register 215; an ID CODE register 216; an instruction register 217; and a TRS terminal 224 for receiving a reset signal. The bypass register 215 serves to transfer communication data without allowing the communication data to pass through the boundary cells, and the ID CODE register 216 serves to discriminate sources of the communication data by outputting individually assigned ID CODES. The instruction register 217 serves to decode specified data selected among the communication data so as to perform a transition of the operation mode independently of a TMS signal. It should be noted that the bypass register 215, the ID CODE register 216 and the instruction register 217 are called a boundary scan register (118).

Descriptions for terminals and signals inputted/outputted to/from the terminals will be made as follows. A TDI (Test Data In) is a signal for allowing instructions and data to be serially inputted to a test logic, and sampled at a rising edge of the TCK. A TDO (Test Data Out) is a signal for allowing the data from the test logic to be serially outputted, and changes an output value of the data at a falling edge of the TCK. The TCK (Test Clock) supplies clocks to the test logic. The TCK is an input terminal for permitting a serial test data path to be exclusively used independently of a system clock inherent to the component. A TMS (Test Mode Select) is a signal for controlling a test operation, and sampled at the rising edge of the TCK. This signal is decoded by a TAP controller. A TRST (Test Reset) is a negative logic symbol for initializing the TAP controller asynchronously, and is optionally used.

The integrated circuit 210 in which such boundary scan element is integrated can be tested for its operation state and its connection with any external equipment according to the procedures described below.

First, when it is checked whether an internal logic 211 of the integrated circuit 210 is good or bad, serial data (test data) is shifted while the test data is supplied to a TDI terminal 220 of the integrated circuit 210, and the test data is set in each boundary cell 214 provided for corresponding one of input terminals 212. In this situation, the integrated circuit 210 is operated, and thereafter the data is allowed to be shifted, which has already been set in each boundary cell 214 provided for corresponding one of output terminals 213. The shifted data is permitted to be outputted from a TDO terminal 221, whereby it is checked whether the internal logic 211 of the integrated circuit 210 is good or bad, based on a correlation between serial data obtained (test result data) and the test data inputted to the integrated circuit 210.

Furthermore, the boundary scan testing method can be executed also for a plurality of integrated circuits as long as the boundary scan element is incorporated in each of the integrated circuits.

Figure 4:
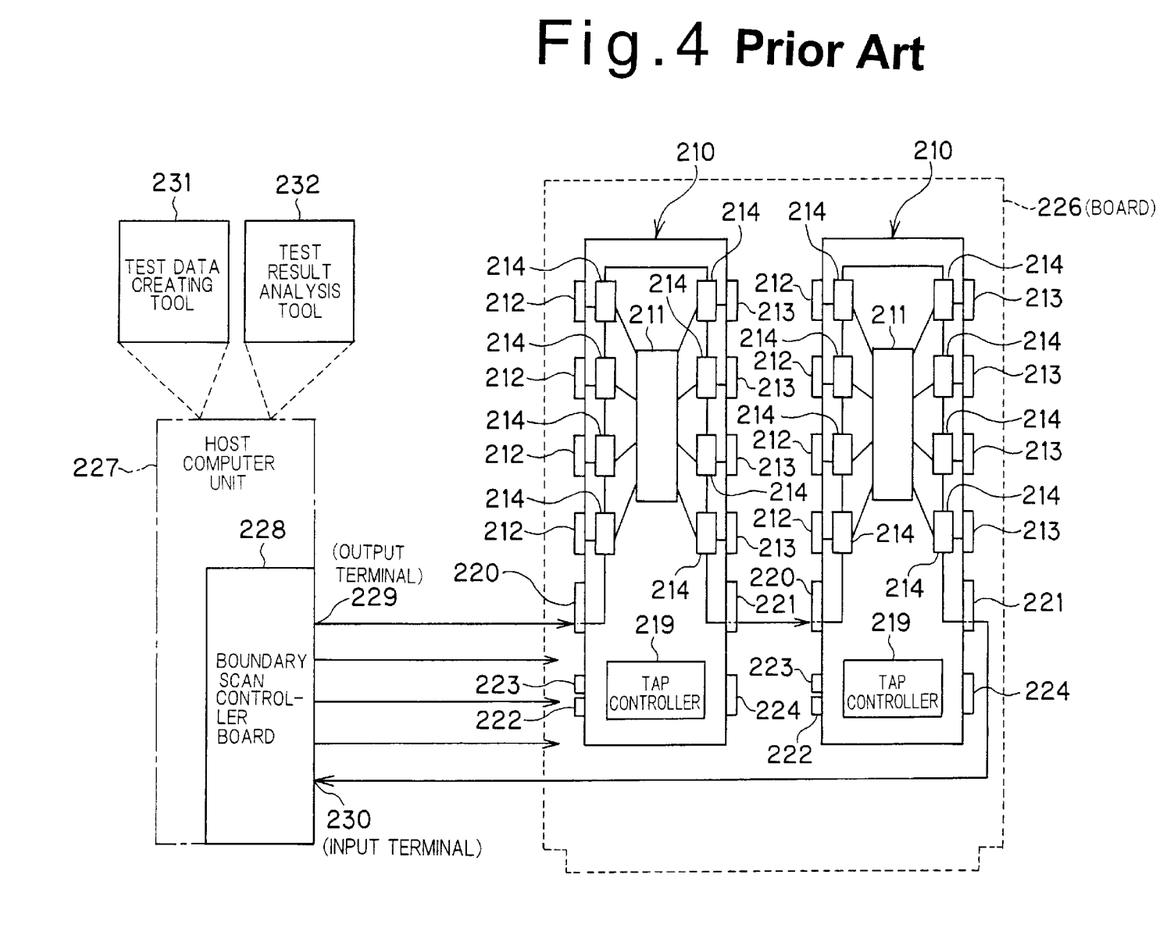
FIG. 4 is a block diagram showing an example of a boundary scan test using the boundary scan element shown in FIG. 3.

For example, as for the plurality of integrated circuits 210 loaded on a board 226 as shown in FIG. 4, disconnections of printed patterns between the integrated circuits 210 can be checked, in addition to a test of the integrated circuit 210 itself.

In this case, the boundary scan elements incorporated in the plurality of integrated circuits 210 are connected in series. Specifically, the TDO terminal 221 of the first integrated circuit 210 shown in the left in FIG. 4 and the TDI terminal 220 of the second integrated circuit 210 shown in the right in FIG. 4 are connected. Moreover, an output terminal 229 of a boundary scan controller board 228 provided in a host computer unit 227 is connected to the TDI terminal 220 of the first integrated circuit 210, and an input terminal 230 of the boundary scan controller board 228 is connected to the TDO terminal 221 of the second integrated circuit 210. The test procedures are as follows.

Figure 5:
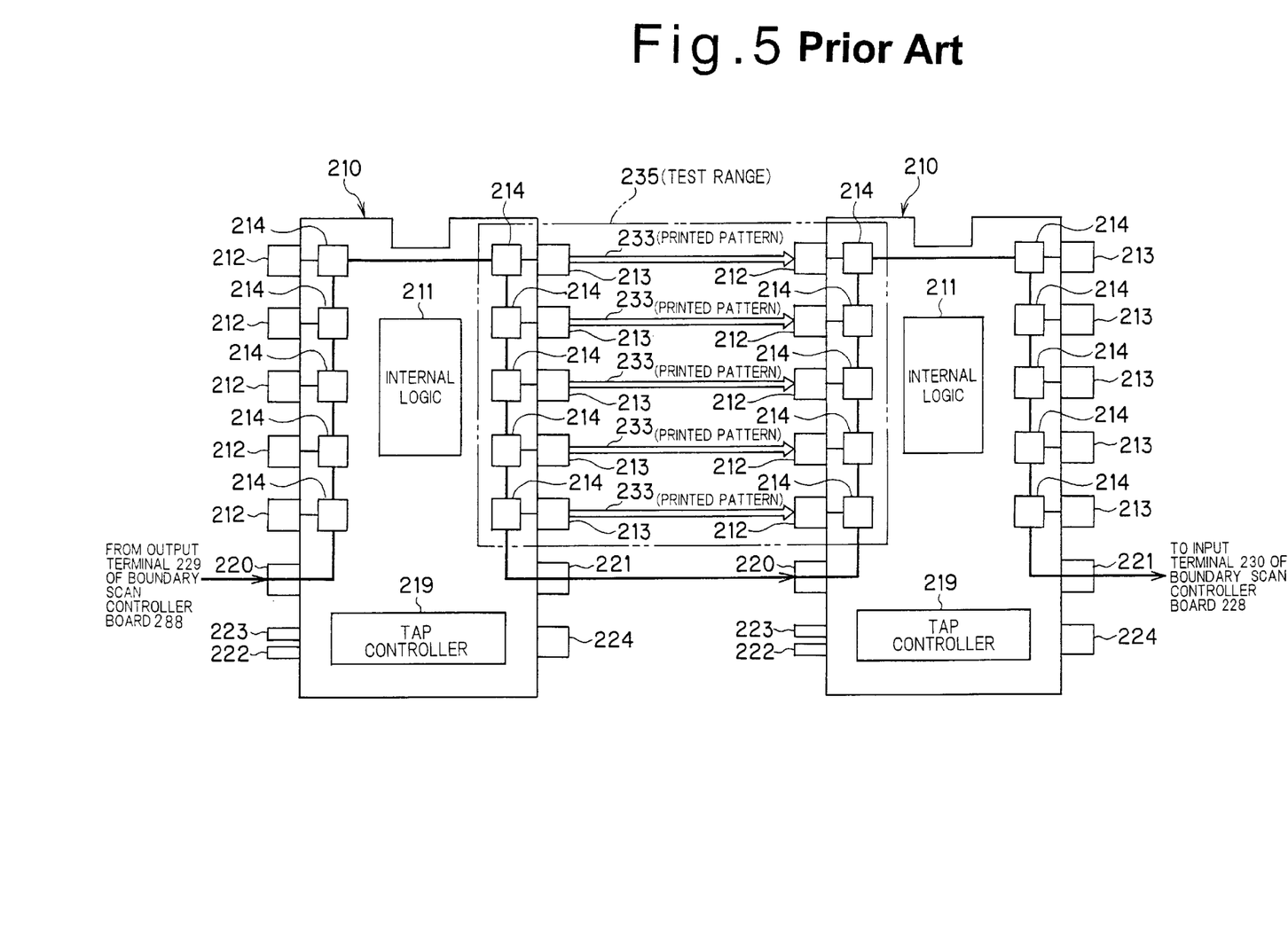
FIG. 5 is a schematic diagram showing an example of the boundary scan test using the boundary scan element shown in FIG. 3.

In the case where the disconnection and short circuit of the printed pattern are tested, the test data (serial data) is created using a test data creation tool 231 and the like, and the test data (serial data) is outputted from the output terminal 229 of the boundary scan controller board 228. The test data (serial data) is shifted while the test data is being inputted to the TDI terminal 220 of the first integrated circuit 210, thereby setting the test data in each boundary cell 214 provided for corresponding one of the output terminals 213 of the first integrated circuit 210. In this situation, data stored in each boundary cell 214 is outputted from corresponding one of the output terminals 213 provided in the first integrated circuit 210 as shown in FIG. 5, and the data from each output terminal 213 is inputted, via each printed pattern 233 constituting a system bus and the like, to corresponding one of the input terminals 212 of the second integrated circuit 210. Moreover, the data is taken into each boundary cell 214 provided for corresponding one of the input terminals 212.

Thereafter, the data stored in each boundary cell 214 of the first and second integrated circuits 210 is shifted, and the data is analyzed with a test result analysis tool 232 and the like while the data is taken into an input terminal 230 of the boundary scan controller board 228. Thus, the check for the disconnection and short circuit of the printed pattern can be performed within a test range 235 of the printed pattern 233 connecting between the integrated circuits 210.

Figure 7:
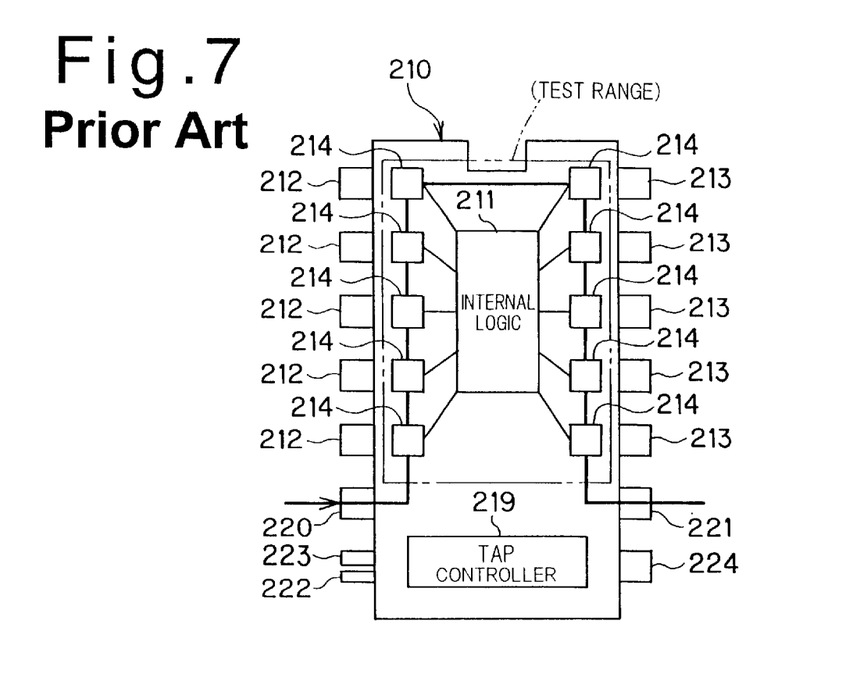
FIG. 7 is a schematic diagram showing an example of the boundary scan test using the boundary scan element shown in FIG. 3.

Next, in the case where the internal logic 211 of each integrated circuit 210 is examined, the test data is shifted while the test data is being outputted from an output terminal 229 of the boundary scan controller board 228 to the TDI terminal 220 of the first integrated circuit 210. As shown in FIG. 7, the test data is set in each boundary cell 214 provided for corresponding one of the input terminals 212 of the first integrated circuit 210.

Figure 6:
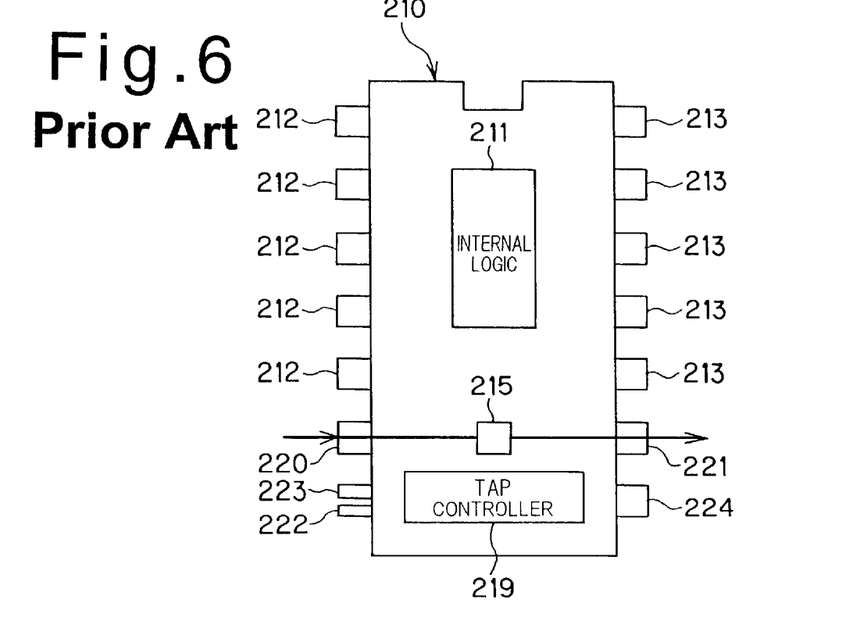
FIG. 6 is a schematic diagram showing an example of the boundary scan test using the boundary scan element shown in FIG. 3.

Subsequently, the first integrated circuit 210 is operated, and the data obtained by the operation of the first integrated circuit 210 is taken into each boundary cell 214 provided for corresponding one of the output terminals 213. Thereafter, the data stored in each boundary cell 214 is shifted, and outputted from the TDO terminal 221 of the first integrated circuit 210. At this time, the second integrated circuit 210 is allowed to be bypassed by the boundary scan controller board 228 as shown in FIG. 6, whereby the data outputted from the TDO terminal 221 is taken into the input terminal 230 of the boundary scan controller board 228, bypassing the second integrated circuit 210. Then, by analyzing the data taken into the input terminal 230 using the test analysis tool 232 and the like, it can be checked whether or not the first integrated circuit 210 operates correctly.

Next, in the case where the second integrated circuit 210 is checked, the first integrated circuit 210 is similarly permitted to be bypassed by the boundary scan controller board 228 as shown in FIG. 6, and then the test data is outputted from the output terminal 229 of the boundary scan controller board 228, and the first integrated circuit 210 is bypassed. Then, the test data is shifted while the test data is being inputted to the TDI terminal 220 of the second integrated circuit 210, and the test data is set in each boundary cell 214 provided for corresponding one of the input terminals 212 of the second integrated circuit 210 as shown in FIG. 7. Subsequently, this integrated circuit 210 is operated, and the data obtained by the operation of this integrated circuit is taken into each boundary cell 214 provided for corresponding one of the output terminals 213. Thereafter, the data stored in each boundary cell 214 is shifted to be outputted from the TDO terminal 221, and moreover, the data is taken into by the input terminal 230 of the boundary scan controller board 228. Then, the data taken in is analyzed using the test result analysis tool 232 and the like, whereby it can be checked whether the second integrated circuit 210 operates correctly.

Thus, as for the board 226 employing the integrated circuits 210 in which the boundary scan element is incorporated, the quality of each integrated circuit 210 itself and the relation in the connection between the integrated circuits 210 can be tested by implementing the boundary scan testing method.

Hereupon, the inventor of the present invention has found that when a board for a sensor module is constructed using the integrated circuits in which such boundary scan element is incorporated, the inputting/outputting of the serial data can be performed for each integrated circuit loaded on the board 226 at a speed of about 20 Mbps without using an integrated circuit for use in communication.

Then, the inventor of the present invention has proposed a communication apparatus which uses the boundary scan element to perform communication with a host computer unit and the like without using communication devices.

Figure 8:
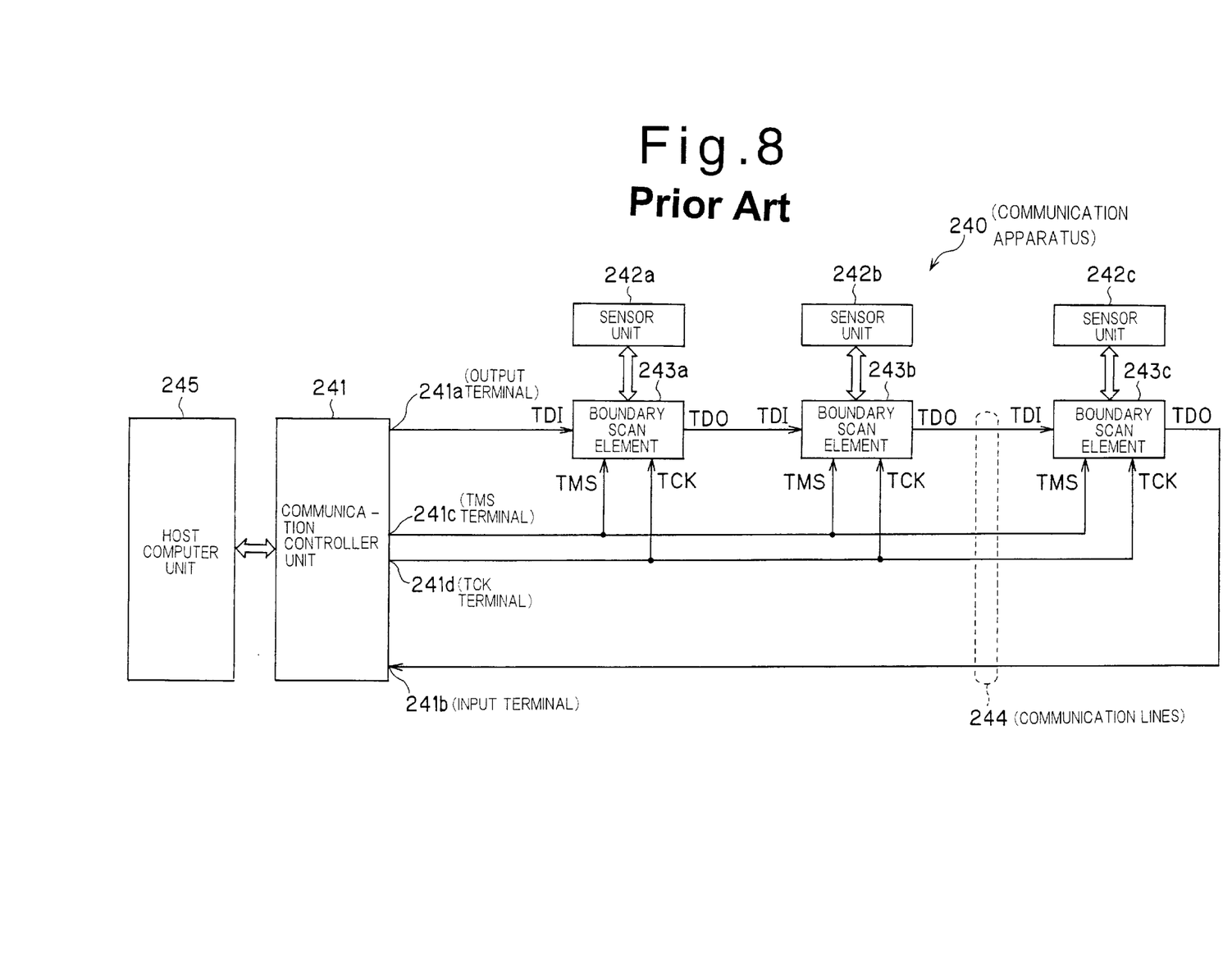
FIG. 8 is a block diagram showing an example of a conventional communication apparatus to which the boundary scan element i s applied.

FIG. 8 is a block diagram showing an example of the communication apparatus in which the boundary scan element is employed.

The communication apparatus 240 shown in FIG. 8 includes a communication controller unit 241 for executing transmission and collection of communication data; a plurality of sensor units 242a to 242c for executing monitoring of an object; a plurality of boundary scan elements 243a to 243c, each of which is arranged for corresponding one of the sensor units 242a to 242c, takes in control data outputted from the foregoing communication controller unit 241 to supply the control data to corresponding one of the sensor units 242a to 242c, and takes in detection data outputted from corresponding one of the sensor units 242a to 242c to supply the detection data to the foregoing communication controller unit 241; and communication lines 244 connecting the boundary scan elements 243a to 243c to the foregoing communication controller unit 241.

The boundary scan elements 243a to 243c are connected in series to the communication controller unit 241. Specifically, the output terminal 241a of the communication controller unit 241 is connected to the TDI terminal of the boundary scan element 243a, the TDO terminal of the boundary scan element 243a is connected to the TDI terminal of the subsequent boundary scan element 243b, and the TDO terminal of the boundary scan element 243c is connected to the input terminal 241b of the communication controller unit 241.

The function of the communication apparatus 240 is as follows.

Each of the boundary scan elements 243a to 243c functions in synchronization with clock signals transmitted from the TCK terminal 241d of the communication controller unit 241, and an operation mode of each TAP controller is switched by a TMS signal transmitted from the TMS terminal 241c of the communication controller unit 241.

Then, in the case where each of the sensor units 242a to 242c is driven based on an instruction from the host computer unit 245, control data (serial data) is outputted from the output terminal 241a of the communication controller unit 241 so as to be supplied to each of the boundary scan elements 243a to 243c, thus setting the control data in the boundary cells corresponding to the output terminal. Subsequently, the control data set in each of the boundary cells is outputted, and then supplied to each of the sensor units 242a to 242c provided for corresponding one of the boundary scan elements 243a to 243c, so that the sensor units 242a to 242c are driven.

Furthermore, in the case where the detection data is collected from each of the sensor units 242a to 242c based on the instruction from the host computer unit 245, the detection data and the like from the sensor units 242a to 242c are once set in the boundary cells corresponding to the input terminals of the boundary scan elements 243a to 243c, respectively. Then, these data are respectively outputted from the TDO terminals as serial data, and these data are taken in by the input terminal 241b of the communication controller unit 241.

In such communication apparatus 240, in the case where the control data is set in each of the boundary scan elements 243a to 243c or in the case where the detection data and the like are outputted from each of the boundary scan elements 243a to 243c, the data transfer speed can be set to up to 20 Mbps, thus enabling the communication data to be transferred at a higher speed compared to conventional communication apparatus.

However, with the conventional boundary scan element, in the case where the boundary scan testing method is carried out for circuits in which two integrated circuits are connected in parallel to one integrated circuit, individual tests cannot be carried out in parallel for the two integrated circuits, so that it has been sometimes impossible to perform a series of processings smoothly.

Moreover, in the conventional boundary scan element, since all the boundary cells are connected in series to each other, even when it is intended to transfer the data to the output terminal side boundary cell, data must be shifted via the input terminal side boundary cell. Accordingly, the transfer speed can be slow.

DISCLOSURE OF THE INVENTION

The object of the present invention is to provide a boundary scan element which enables acceleration of the foregoing processings, and a communication apparatus using the same.

According to the present invention, there is provided a boundary scan element comprising a plurality of input terminal side boundary cells which are connected in series, each being individually allocated to corresponding one of input terminals; a plurality of output terminal side boundary cells which are connected in series, each being individually allocated to corresponding one of output terminals; a TAP circuit for controlling input/output of data to/from the boundary cells on the input/output terminal sides; a TDI terminal for receiving serial data to be supplied to said boundary cells; a TDO terminal for outputting the data from said boundary cells as serial data; a TCK terminal for receiving clock signals; and a TMS terminal for receiving a mode signal to switch an operation mode of said TAP circuit, wherein said boundary cells on the input/output terminal sides are connected in parallel between said TDI and TDO terminals, respectively, and wherein two sets of combinations composed of said input terminal side boundary cells, said output terminal side boundary cells, the foregoing TDI terminal, said TDO terminal and said TAP circuit are provided.

Since in the boundary scan element of the present invention, the two sets of combinations composed of the foregoing input terminal side boundary cells, the foregoing output terminal side boundary cells, the foregoing TDI terminal, the foregoing TDO terminal and the foregoing TAP circuit are provided, test data and the like can be input/output for each combination. Therefore, even when the boundary scan testing method is carried out for the circuit in which two integrated circuits are connected in parallel to one integrated circuit, it is possible to execute individual tests for the two integrated circuits simultaneously, so that a series of processings can be performed smoothly.

Furthermore, in the boundary scan element of the present invention, all the boundary cells are not connected in series to each other like the conventional boundary scan element, and the input terminal side boundary cells and the output terminal side boundary cells are connected in parallel between the TDI terminal and the TDO terminal.

Accordingly, it will be possible to directly input/output the data to/from the boundary cells on the input/output terminal sides, resulting in an increase in a data transfer speed.

Moreover, according to the present invention, there is provided a communication apparatus comprising a plurality of boundary scan elements which comprises a plurality of input terminal side boundary cells connected in series, each being individually allocated to corresponding one of input terminals, a plurality of output terminal side boundary cells connected in series, each being individually allocated to corresponding one of output terminals, a TAP circuit for controlling input/output of data to/from the boundary cells on the input/output terminal sides, a TDI terminal for receiving serial data to be supplied to said boundary cells, a TDO terminal for outputting the data from said boundary cells as serial data, a TCK terminal for receiving clock signals, and a TMS terminal for receiving a mode signal to switch an operation mode of said TAP circuit, wherein said input terminal side boundary cells and said output terminal side boundary cells are connected in parallel between said TDI terminal and said TDO terminal, respectively; a plurality of terminal equipments, each having either an IC connected to corresponding one of said boundary scan elements or an IC in which corresponding one of said boundary scan elements is incorporated; and a communication controller for transmitting/receiving communication data via said boundary scan elements, the communication data individually controlling said terminal equipment; wherein said boundary scan element comprises two sets of combinations composed of the input terminal side boundary cells, the output terminal side boundary cells, the TDI terminal, the TDO terminal and the TAP circuit, and wherein the communication controller comprises two terminal portions composed of a communication data output terminal for transmitting the communication data to the boundary scan element and a communication data input terminal for receiving the communication data from the boundary scan element, one of the combinations of the boundary scan element being connected in series to either of the terminal portions and the other of the combinations of the boundary scan element being connected in series to the other terminal portion so that the transfer directions of the communication data are inverse to each other.

The present invention relates to a communication apparatus using the boundary scan element described above, in particular, the apparatus which is capable of coping with disconnections of communication lines connecting the components.

In the present invention, the foregoing boundary scan elements, each of which comprises the two sets of combinations capable of individually performing a communication processing for the foregoing terminal equipment, are connected, and the foregoing combinations are connected independently to the foregoing communication controller so that the transfer directions of the communication data are inverse to each other.

Accordingly, the communication processing is normally performed using only one of the foregoing combinations, and when disconnection occurs in a part of the communication lines, the communication processing is performed using the other combination, whereby it is possible to input/output the communication data to/from all of the foregoing terminal equipment.

In the communication apparatus of the present invention, the foregoing terminal equipment may be various kinds of sensor units, for example, monitoring camera equipment and the like. In connecting the terminal equipment with the foregoing boundary scan element, the output terminal is connected to an input terminal of the terminal equipment, and the input terminal is connected to an output terminal of the terminal equipment, whereby data of the foregoing boundary cell is outputted to the terminal equipment and, contrary to this, data is inputted to the boundary cell.

The foregoing communication data also includes data detected by and transmitted from the terminal equipment and state data indicating whether or not the terminal equipment operates normally, in addition to the control data transmitted to the terminal equipment in order to control the terminal equipment.

BEST MODE FOR CARRYING OUT THE INVENTION

Content of First Embodiment

Figure 1:
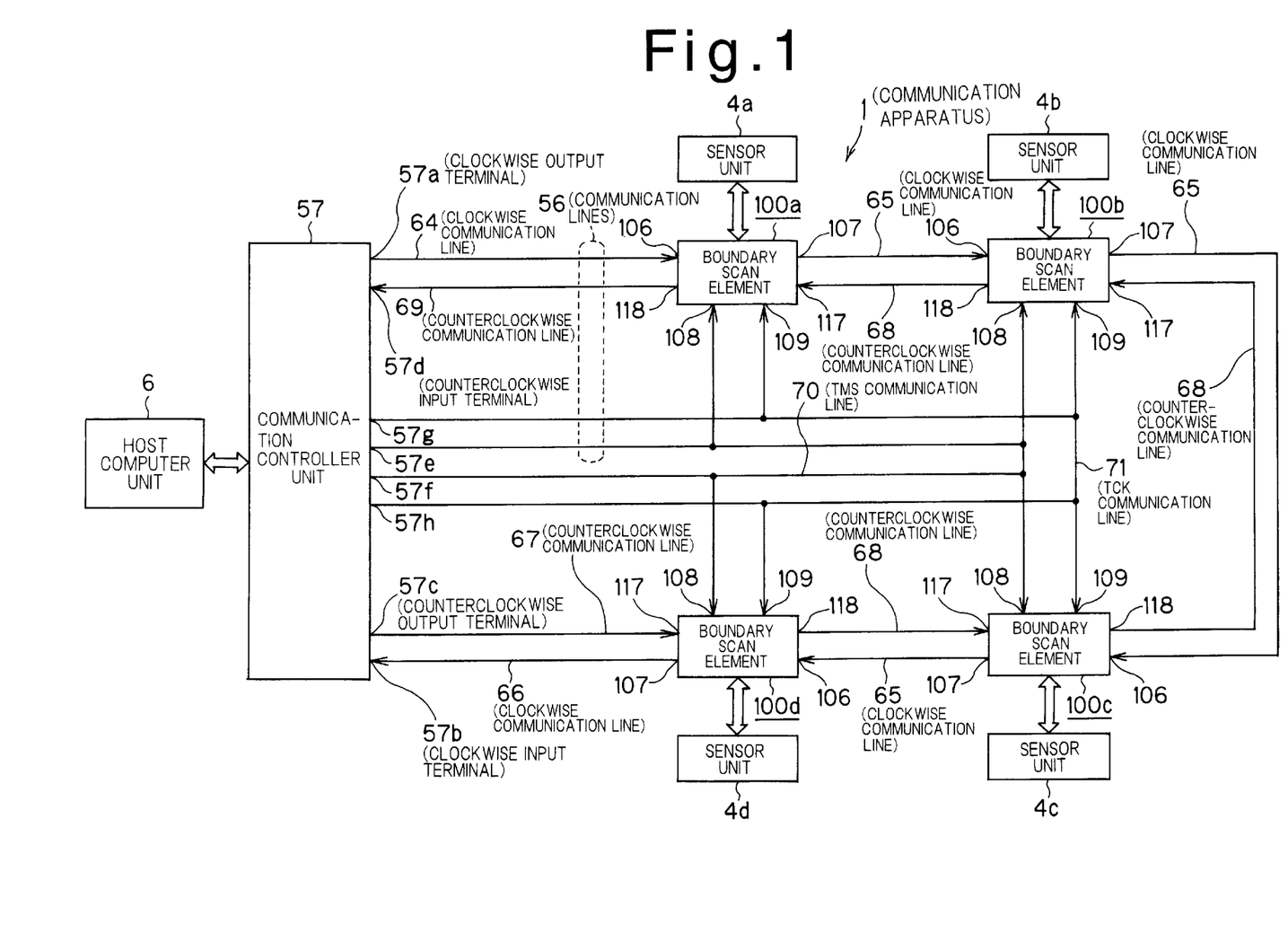
FIG. 1 is a block diagram showing the first embodiment of a communication apparatus of the present invention.

FIG. 1 is a block diagram showing a communication apparatus 1 of the present invention.

The communication apparatus 1 includes a plurality of boundary scan elements 100a to 100d of the present invention, sensor units (terminal equipment) 4a to 4d connected to corresponding one of the boundary scan elements 100a to 10d, a communication controller unit 57 for controlling the sensor units 4a to 4d via the boundary scan elements 100a to 100d, and a host computer unit 6 connected to the communication controller unit 57.

Figure 2:
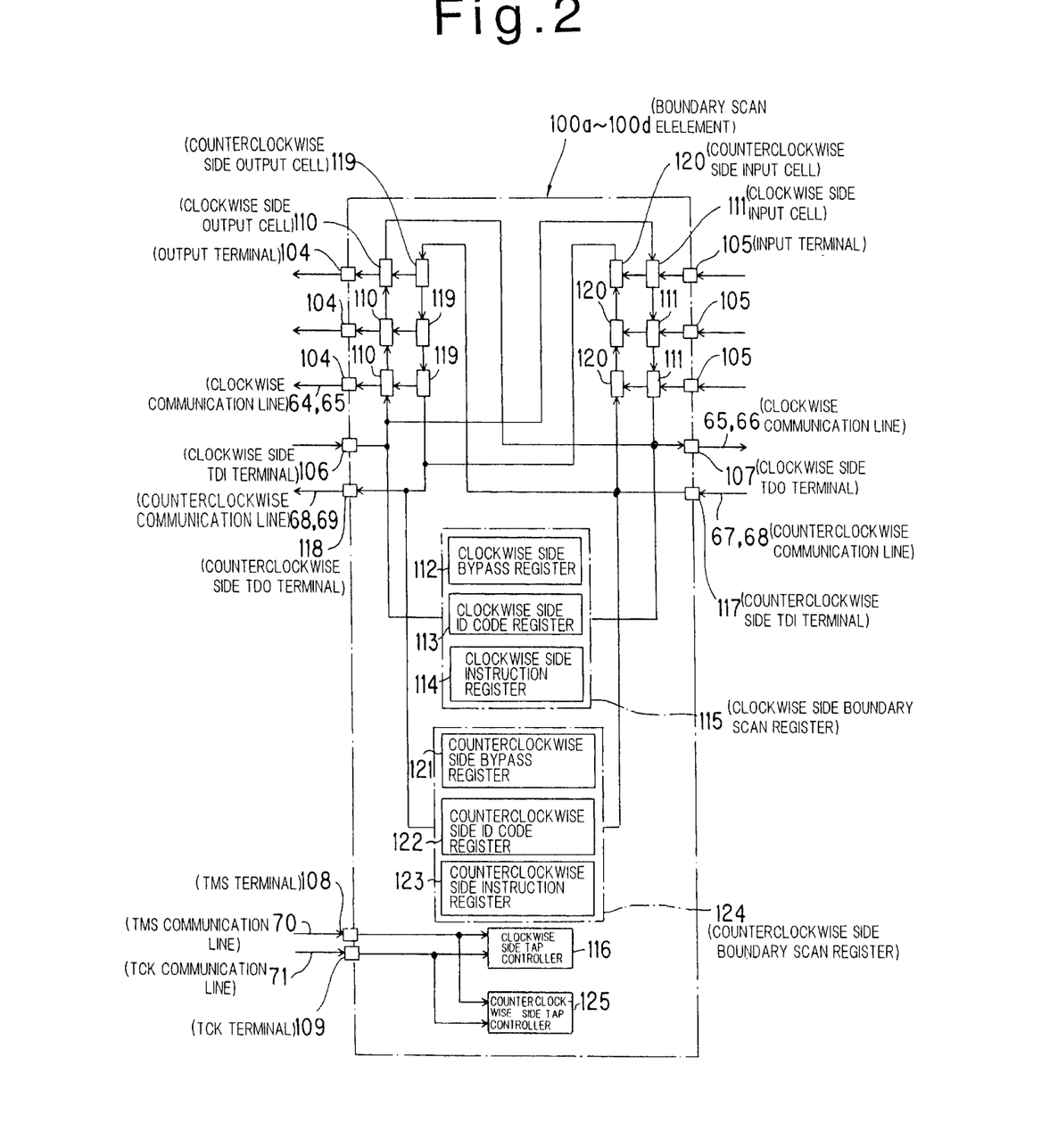
FIG. 2 is a block diagram of boundary scan elements 100a to 100d of the communication apparatus 1.

Each of the boundary scan elements 100a to 100d is, as shown in FIG. 2, structured as one package composed of a plurality of input cells (input terminal side boundary cells) 111 and 120 connected in series, each being allocated individually to corresponding one of input terminals 105; a plurality of output cells (output terminal side boundary cells) 110 and 119 connected in series, each being individually allocated to corresponding one of output terminals 104; TAP controllers (TAP circuit) 116 and 125 for controlling input/output of communication data to/from the input cells 111 and 120 and output cells 110 and 119; TDI terminals 106 and 117 for receiving serial data to be supplied to the input cells 111 and 120 and the output cells 119 and 110; TDO terminals 107 and 118 for outputting the communication data of the input cells 111 and 120 and the output cells 110 and 119 as serial data; a TCK terminal 109 for receiving clock signals; and a TMS terminal 108 for receiving a mode signal to switch operation modes of the TAP controllers 116 and 125. Each of the boundary scan elements 100a to 100d may optionally include either a boundary scan register 115 or a boundary scan register 124, which is composed of either a bypass register 112 or a bypass register 121, either an ID code register 113 or an ID code register 122, and either an instruction register 114 or an instruction register 123.

It should be noted that the input terminals 105 of the boundary scan elements 100a to 100d are connected to corresponding output terminals (not shown) of the sensor units 4a to 4d, the output terminals 104 of the boundary scan elements 100a to 100d are connected to corresponding input terminals (not shown) of the sensor units 4a to 4d, so that the communication data set in either the output cells 110 or the output cells 119 is transmitted to the corresponding sensor units 4a to 4d, and the communication data from the sensor units 4a to 4d is transmitted to the input cells 111 or 120 to be set therein.

Herein, each of the boundary scan elements 100a to 100d has two sets of combinations, each composed of a boundary cell, a TDI terminal, a TDO terminal, and a TAP controller. Specifically, one of the combination is composed of a clockwise side input cell 111, a clockwise side output cell 110, a clockwise side TDI terminal 106, a clockwise side TDO terminal 107, and a clockwise side TAP controller 116 (hereinafter referred to as a clockwise combination), and the other composed of a counterclockwise side input cell 120, a counterclockwise side output cell 119, a counterclockwise side TDI terminal 117, a counterclockwise side TDO terminal 118, and a counterclockwise side TAP controller 125 (hereinafter referred to as a counterclockwise combination).

One of the input cells 111 and 120 and one of the output cells 110 and 119 are connected in parallel between one of the TDI terminals 106 and 117 of the combination and one of the TDO terminals 107 and 118 of the combination, whereby the communication data can be directly transferred from the TDI terminals 106 and 117 to one of the input cells 111 and 120 and one of the output cells 110 and 119, and the communication data of one of the input cells 111 and 120 and the communication data of one of the output cells 110 and 119 can be directly outputted from one of the TDO terminals 107 and 118.

Therefore, the boundary scan elements 100a to 100d can increase the transfer speed of the data relating to the input cells 111 and 120 and the output cells 110 and 119, compared to the conventional boundary scan elements in which all of the boundary cells are connected in series.

It should be noted that although the input cells 111 and 120 are connected in series to the input terminal 105 and the output cells 110 and 119 are connected in series to the output terminal 104 in the example of FIG. 2, the input cells 111 and 120 and the output cells 110 and 119 may be connected in parallel to the input terminal 105 and the output terminal 104, respectively.

The TAP controllers 116 and 125 are connected in parallel to the TMS terminal 108 and the TCK terminal 109, respectively, and function in synchronization with each other. The clockwise side TAP controller 116 controls input/output of the communication data relating to the clockwise combination, and the counterclockwise side TAP controller 125 controls input/output of the communication data relating to the counterclockwise combination.

A boundary scan register, if any, is provided for each combination. Specifically, as shown in FIG. 2, the clockwise side boundary scan register 115 is connected between the clockwise side TDI terminal 106 and the clockwise side TDO terminal 107, and the counterclockwise side boundary scan register 124 is connected between the counterclockwise side TDI terminal 117 and the counterclockwise side TDO terminal 118.

In the boundary scan elements 100a to 100d having such constructions, the foregoing two combinations perform the communication processing independently of each other.

Accordingly, even when the boundary scan testing method is executed, for example, for the circuits and the like in which two integrated circuits are connected in parallel to one integrated circuit, integrated circuits connected in parallel are connected to the combinations of the boundary scan elements 100*a* to 100*d*, whereby individual tests can be executed in parallel for these two integrated circuits.

Next, the sensor units 4*a* to 4*d* include various kinds of sensors for measuring temperature, pressure, and the like, which are disposed in such a position as to correspond to objects to be monitored; or a monitoring circuit for monitoring an operation state of a CPU circuit that is to be monitored. The sensor units 4*a* to 4*d* execute a measuring operation or a monitoring operation depending on measuring conditions, monitoring conditions and the like that are designated by control data and the like given via the boundary scan elements 100*a* to 10*d*, and transmit measurement results, monitor results and the like, which are obtained by these operations, to the communication controller unit 57 via the boundary scan elements 100*a* to 10*d*.

The communication controller unit 57 has a hardware circuit, a microprocessor circuit and the like, and transmits a necessary signal from a TMS terminal 57*e* or 57*f* and the TCK terminal 57*g* or 57*h* to the TMS terminal 108 and TCK terminal 109 of the boundary scan elements 100*a* to 100*d* via a TMS communication line 70 and a TCK communication line 71, based on instruction contents outputted from the host computer unit 6. The communication controller unit 57 thus drives the boundary scan elements 100*a* to 10*d*.

The communication controller unit 57 further includes a terminal portion composed of a clockwise side output terminal (communication data output terminal) 57*a* and a clockwise side input terminal (communication data input terminal) 57*b*, and a terminal portion composed of a counterclockwise side output terminal (communication data output terminal) 57*c* and a counterclockwise side input terminal (communication data input terminal) 57*d*, and transmits control data for controlling the sensor units 4*a* to 4*d* from the clockwise side output terminal 57*a* and the counterclockwise side output terminal 57*c*. The communication controller unit 57 receives detection data or state data from the sensor units 4*a* to 4*d* through the clockwise side input terminal 57*b* and the counterclockwise side input terminal 57*d*, and performs processing to supply the detection data or the state data to the host computer unit 6.

Hereupon, in the communication apparatus 1, the communication controller unit 57 and the clockwise and counterclockwise combinations are connected so that the transfer direction of the communication data in the clockwise combination of the boundary scan elements 100*a* to 100*d* is inverse to the transfer direction of the communication data in the counterclockwise combination.

Specifically, the clockwise combination in all of the boundary scan elements 100*a* to 100*d* is connected in series to the communication controller unit 57 via the clockwise communication lines 64, 65 and 66, and the counterclockwise combination in all of the boundary scan elements 100*a* to 100*d* is connected in series to the communication controller unit 57 via the counterclockwise communication lines 67, 68 and 69.

The clockwise side output terminal 57*a* of the communication controller unit 57 is connected to the clockwise side TDI terminal 106 of the boundary scan element 100*a* via the clockwise communication line 64, and each clockwise side TDO terminal 107 and each clockwise side TDI terminal 106 between the boundary scan elements 100*a* to 100*d* are connected via the clockwise communication line 65. Finally, the clockwise side TDO terminal 107 of the boundary scan element 100*d* is connected to the clockwise side input terminal 57*b* of the communication controller unit 57 via the clockwise communication line 66.

With such a structure, the control data transmitted from the clockwise side output terminal 57*a* of the communication controller unit 57 to the clockwise combination of the boundary scan elements 100*a* to 100*d* is always transferred in the direction shown by the order of the boundary scan elements 100*a*→100*b*→100*c*→100*d*, or alternatively the detection data and the state data obtained by the clockwise combination from the sensor units 4*a* to 4*b* are always transferred in the direction shown by the order of the boundary scan elements 100*a*→100*b*→100*c*→100*d*.

On the other hand, the counterclockwise side output terminal 57*c* of the communication controller unit 57 is connected to the counterclockwise side TDI terminal 117 of the boundary scan element 100*d* via the counterclockwise communication line 67, and the counterclockwise side TDO terminal 118 and the counterclockwise side TDI terminal 117 between the boundary scan elements 100*d* to 100*a* are connected to each other via the counterclockwise communication line 68. Finally, the counterclockwise side TDO terminal 118 of the boundary scan element 100*a* is connected to the counterclockwise side input terminal 57*d* of the communication controller unit 57 via the counterclockwise communication line 69.

Therefore, the control data transmitted from the counterclockwise side output terminal 57*c* of the communication controller unit 57 to the counterclockwise combination of each of the boundary scan elements 100*d* to 100*a* is always transferred in the direction shown by the order of the boundary scan elements 100*d*→100*c*→100*b*→100*a*, or alternatively the detection data and the state data obtained by the counterclockwise combination from each of the sensor units 4*a* to 4*b* are always transferred in the direction shown by the order of the boundary scan elements 100*d*→100*c*→100*b*→100*a*.

As described above, the communication controller unit 57 and the boundary scan elements 100*a* to 100*d* are connected in order to cope with the incident where the communication line 56 is disconnected. An operation of the communication apparatus 1 composed of such constitution will be described principally as to this point.

In a normal communication processing without disconnection of the communication line 56, the communication apparatus 1 performs the communication processing by driving only the clockwise combination of the boundary scan elements 100*a* to 100*d*.

Specifically, when an instruction to drive the sensor units 4*a* to 4*d* is transmitted from the host computer unit 6, the control data in response to the instruction is created in the communication controller unit 57. Then, the communication controller unit 57 transmits a mode signal from the TMS terminal 57*e* or 57*f*, and switches the operation mode of each of the boundary scan elements 100*a* to 100*d* to required mode. At the same time, the communication controller unit 57 transmits the control data from the clockwise side output terminal 57*a* to the clockwise combination of each of the boundary scan elements 100*a* to 100*d* via the clockwise communication lines 64 and 65, whereby the control data is set in the clockwise side output cell 110 of the boundary scan elements 100*a* to 100*d*.

Next, the communication controller unit 57 outputs the mode signal indicating the output instruction of the control data from the TMS terminal 57*e* or 57*f*, whereby the control data that has been set in the clockwise side output cell 110 is transmitted from the output terminal 104 to the corresponding sensor units 4*a* to 4*d*.

The sensor units 4a to 4d execute the measuring operation or the monitoring operation in response to the content of the control data received. Moreover, the sensor units 4a to 4d output the measurement data, the monitoring data or the state data of the sensor units 4a to 4d to the corresponding boundary scan elements 100a to 100d, in response to the content of the control data.

Next, when an instruction for collecting the measurement data of the sensor units 4a to 4d is transmitted from the host computer unit 6, the communication controller unit 57 transmits the mode signal from the TMS terminal 57e or 57f, and switches the operation mode of each of the boundary scan elements 100a to 100d to required mode. From the corresponding sensor units 4a to 4d, the detection data such as the measurement data is set in the clockwise side input cell 111 via the input terminal 105 of each of the boundary scan elements 100a to 100d. Thereafter, the detection data that has been set in the clockwise side input terminal 111 is transferred to the clockwise side input terminal 57b of the communication controller unit 57 via the clockwise communication lines 65 and 66. Either the host computer unit 6 or the communication controller unit 57 performs an analysis of the detection data received.

On the other hand, during the performance of the above-described communication processing in which only the clockwise combination of the boundary scan elements 100a to 100d is driven, in the case where the communication line 56 is partly disconnected, for example, between the boundary scan elements 100b and 100c, the communication controller unit 57 will be incapable of transmitting the control data to the sensor units 4c and 4d, and incapable of receiving the detection data or the state data from the sensor units 4a and 4b.

In this case, the communication controller unit 57 can specify the occurrence of the disconnection and the disconnection portion based on the fact that the detection data or the state data from the sensor units 4a and 4b is not included in the communication data received from the clockwise side input terminal 57b.

Herein, since the counterclockwise combination of the boundary scan elements 100a to 100d exhibits the transfer direction of the communication data inverse to that of the clockwise combination, the communication controller unit 57 controls this counterclockwise combination, whereby the communication controller unit 57 can receive the detection data or the state data of the sensor units 4a and 4b, and transfer the communication data to the sensor units 4c and 4d.

Accordingly, the communication controller unit 57 transmits the mode signal from the TMS terminal 57e or 57f, and drives not the clockwise combination of the boundary scan elements 100a to 100d but the counterclockwise combination, whereby the detection data or the state data of the sensor units 4a and 4b that is not yet received by the communication controller unit 57 is set in the counterclockwise side input cell 120. Then, the detection data and the like of the sensor units 4a and 4b set in each counterclockwise side input cell 120 is transferred to the counterclockwise side input terminal 57d of the communication controller unit 57 via the counterclockwise communication lines 68 and 69.

Similarly, the communication controller unit 57 transmits new control data from the counterclockwise side output terminal 57c to the counterclockwise side output cell 119 of the boundary scan elements 100c and 100d via the counterclockwise communication lines 67 and 68, whereby the communication controller unit 57 can also transmit the new control data to the sensor units 4d and 4c via the output terminal 104.

Therefore, even when the disconnection occurs in a part of the communication line 56, the communication controller unit 57 will be capable of transmitting/receiving the communication data to/from all of the sensor units 4a to 4d.

As described above, in the communication apparatus 1, the boundary scan elements 100a to 100d having the foregoing two combinations, each of which can independently perform the communication processing, are connected to the sensor units 4a to 4d, and the transfer directions of the communication data in the combinations are made to be inverse to each other, so that the communication apparatus 1 can transmit the communication data to the sensor units 4a to 4d and receive the communication data from the sensor units 4a to 4d, even when the communication line 56 is disconnected.

What is claimed is:

1. A boundary scan element comprising: a plurality of input terminal side boundary cells connected in series, each being individually allocated to corresponding one of input terminals; a plurality of output terminal side boundary cells connected in series, each being individually allocated to corresponding one of output terminals; TAP circuits for controlling input/output of data to/from said boundary cells on the input/output terminal sides; TDI terminals for receiving serial data to be supplied to said boundary cells; TDO terminals for outputting the data from said boundary cells as serial data; a TCK terminal for receiving clock signals; and a TMS terminal for receiving a mode signal to switch operation modes of said TAP circuits, said boundary cells on the input/output terminal sides being connected in parallel between said TDI and TDO terminals respectively, wherein two sets of combinations, each being composed of said input terminal side boundary cells, said output terminal side boundary cells, said TDI terminal, said TDO terminal and said TAP circuit, are provided, transfer directions of communication data in said two sets of combinations being inverse to each other.

2. A communication apparatus comprising: a plurality of boundary scan elements, each comprising a plurality of input terminal side boundary cells connected in series, each being individually allocated to corresponding one of input terminals; a plurality of output terminal side boundary cells connected in series, each being individually allocated to corresponding one of output terminals; TAP circuits for controlling input/output of data to/from said boundary cells on the input/output terminal sides; TDI terminals for receiving serial data to be supplied to said boundary cells; TDO terminals for outputting the data from said boundary cell as serial data; a TCK terminal for receiving clock signals; and a TMS terminal for receiving a mode signal to switch operation modes of said TAP circuits, wherein said input terminal side boundary cells and said output terminal side boundary cells are connected in parallel between said TDI terminal and said TDO terminal, respectively;

a plurality of terminal equipments, each having either an IC connected to corresponding one of said boundary scan elements or an IC in which corresponding one of said boundary scan elements is incorporated; and a communication controller for transmitting/receiving communication data via said boundary scan elements, the communication data individually controlling said terminal equipments;

wherein each of said boundary scan elements comprises two sets of combinations composed of said input terminal side boundary cells, said output terminal side boundary cells, said TDI terminal, said TDO terminal and said TAP circuit, and wherein said communication controller comprises two sets of terminal portions, each being composed of a communication data output terminal for transmitting the communication data to said boundary scan elements and a communication data input terminal for receiving the communication data from said boundary scan elements, one of the combinations of said boundary scan elements being connected in series to one of said terminal positions and the other of the combinations of said boundary scan elements being connected in series to the other of the terminal portions so that transfer directions of the communication data are inverse to each other.

* * * * *